(12) United States Patent
Dadvand (10) Patent No.: US 12,312,703 B2
(45) Date of Patent: May 27, 2025

(54) NEUTRAL pH COPPER PLATING SOLUTION FOR UNDERCUT REDUCTION (71) Applicant: Texas Instruments Incorporated, Dallas, TX (US)

(72) Inventor: Nazila Dadvand, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/654,247

(22) Filed: May 3, 2024

(65) Prior Publication Data

US 2024/0279835 A1 Aug. 22, 2024

Related U.S. Application Data (62) Division of application No. 16/268,047, filed on Feb. 5, 2019, now abandoned.

(51) Int. Cl.
| | |
|---|---|
| *C25D 3/38* | (2006.01) |
| *C22C 9/04* | (2006.01) |
| *C25D 5/02* | (2006.01) |
| *C25D 5/10* | (2006.01) |
| *C25D 5/50* | (2006.01) |
| *C25D 7/12* | (2006.01) |
| *H01L 23/00* | (2006.01) |

(52) U.S. Cl.
CPC .............. *C25D 3/38* (2013.01); *C25D 5/022* (2013.01); *C25D 5/10* (2013.01); *C25D 5/50* (2013.01); *C25D 7/123* (2013.01); *H01L 24/03* (2013.01); *H01L 24/05* (2013.01); *H01L 24/13* (2013.01); *C22C 9/04* (2013.01); *H01L 2224/03462* (2013.01); *H01L 2224/0401* (2013.01); *H01L 2224/05008* (2013.01); *H01L 2224/05083* (2013.01); *H01L 2224/05118* (2013.01); *H01L 2224/05147* (2013.01); *H01L 2224/05166* (2013.01); *H01L 2224/05184* (2013.01); *H01L 2224/13026* (2013.01); *H01L 2224/13082* (2013.01)

(58) Field of Classification Search
None
See application file for complete search history.

(56) References Cited

U.S. PATENT DOCUMENTS

| | | |
|---|---|---|
| 5,208,186 A | 5/1993 | Mathew |
| 9,147,661 B1 | 9/2015 | Kwon et al. |
| 2004/0113272 A1 | 6/2004 | Chen et al. |
| 2006/0030139 A1 | 2/2006 | Mis et al. |

(Continued)

*Primary Examiner* — Khaja Ahmad
(74) *Attorney, Agent, or Firm* — Dawn Jos; Frank D. Cimino (57) ABSTRACT

A microelectronic device is formed by forming a seed layer that contains primarily zinc. A plating mask is formed over the seed layer, and a copper strike layer is formed on the seed layer using a neutral pH copper plating bath. A main copper layer is formed on the copper strike layer by plating copper on the copper strike layer. The plating mask is subsequently removed. The main copper layer, the copper strike layer, and the seed layer are heated to diffuse copper and zinc, and form a brass layer under the main copper layer, consuming the seed layer between the main copper layer and the substrate. Remaining portions of the seed layer are removed by a wet etch process. The main copper layer and the underlying brass layer provide a conductor structure.

10 Claims, 5 Drawing Sheets

(56) References Cited

U.S. PATENT DOCUMENTS

| | | | |
|---|---|---|---|
| 2012/0074553 A1 | 3/2012 | Hosseini et al. | |
| 2013/0127045 A1 | 5/2013 | Lin et al. | |
| 2013/0256870 A1 | 10/2013 | Huang et al. | |
| 2014/0061915 A1 | 3/2014 | Collins et al. | |
| 2015/0228595 A1 | 8/2015 | Willeke et al. | |
| 2015/0262952 A1* | 9/2015 | Lee | H01L 24/13 |
| | | | 257/737 |
| 2016/0148891 A1 | 5/2016 | Tsao et al. | |
| 2017/0033067 A1 | 2/2017 | Kramp | |
| 2017/0358545 A1* | 12/2017 | Choi | H01L 24/13 |
| 2019/0385964 A1* | 12/2019 | Choi | H01L 24/05 |

\* cited by examiner

NEUTRAL pH COPPER PLATING SOLUTION FOR UNDERCUT REDUCTION

This application is a division of patent application Ser. No. 16/268,047, filed Feb. 5, 2019, the contents of all of which are herein incorporated by reference in its entirety.

FIELD

This disclosure relates to the field of microelectronic devices. More particularly, this disclosure relates to plated copper layers in microelectronic devices.

BACKGROUND

Some microelectronic devices have conductor structures to provide low resistance interconnections. The conductor structures are fabricated by depositing a seed layer, forming a plating mask over the seed layer, and electroplating copper on the seed layer where exposed by the plating mask, removing the plating mask, and then removing the seed layer where exposed by the plated copper. Removing the seed layer commonly removes a portion of the plated copper, resulting in undesirable narrowing of the conductor structures. Moreover, removing the seed layer commonly undercuts the plated copper requiring sufficient overlap of the conductor structures over underlying conductive elements such as vias, undesirably increasing design widths of the conductor structures or restricting the number of the underlying conductive elements.

SUMMARY

The present disclosure introduces a method for forming a microelectronic device having a conductor structure by forming a seed layer that contains primarily zinc on a substrate of the microelectronic device. A plating mask is formed over the seed layer, and a copper strike layer is formed on the seed layer where exposed by the plating mask by a strike electroplating process using a neutral pH copper plating bath. A main copper layer is formed on the copper strike layer by plating copper on the copper strike layer. The plating mask is removed after the main copper layer is formed. The main copper layer, the copper strike layer, and the seed layer are heated to diffuse copper from the copper strike layer and the main copper layer, and zinc from the seed layer, to form a brass layer under the main copper layer. The seed layer between the main copper layer and the substrate is consumed by formation of the brass layer. Remaining portions of the seed layer, which are not part of the brass layer, are removed by a wet etch process. The main copper layer and the underlying brass layer provide the conductor structure. The conductor structure has an undercut less than a thickness of the brass layer, and the brass layer does not extend laterally past the main copper layer more than the thickness of the brass layer.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

Figure 1A:
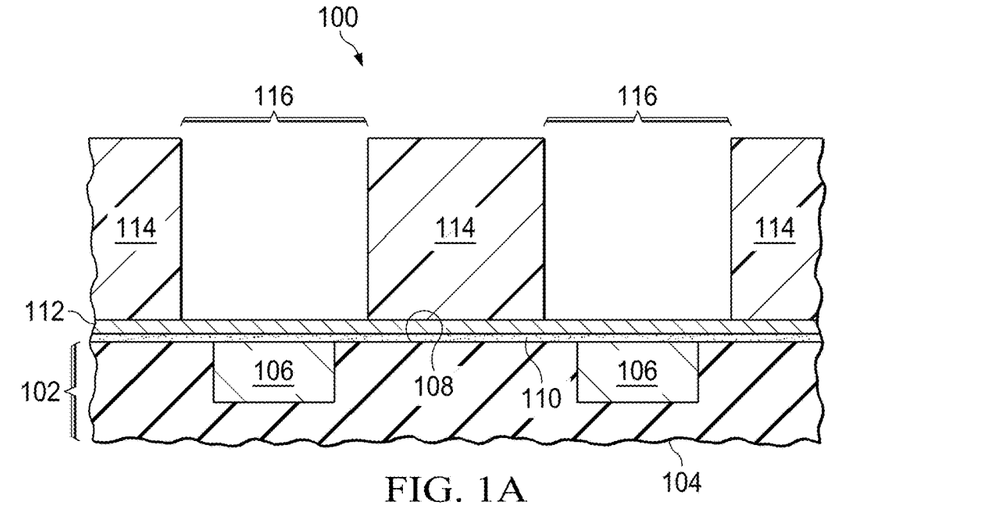
FIG. 1A through FIG. 1H are cross sections of a microelectronic device having a conductor structure, depicted in stages of an example method of formation.

FIG. 1A through FIG. 1H are cross sections of a microelectronic device having a conductor structure, depicted in stages of an example method of formation. Referring to FIG. 1A, the microelectronic device 100 may be implemented, by way of example, as an integrated circuit, a discrete semiconductor component, a micro electro-optical device, a microelectromechanical system (MEMS) device, or a microfluidics device. The microelectronic device 100 has a substrate 102 which may include a dielectric material 104 extending to a connection surface 108 of the substrate 102, and may include electrically conductive elements 106 extending to the connection surface 108. The dielectric material 104 may be part of a dielectric layer stack in an interconnect region of the microelectronic device 100. The dielectric material 104 may include, for example, silicon dioxide, silicon oxynitride, phosphosilicate glass (PSG), borophosphosilicate glass (BPSG), silicon nitride, or aluminum oxide, extending to the connection surface 108. The electrically conductive elements 106 may be interconnects, vias, or input/output (I/O) pads of the microelectronic device 100.

An optional adhesion layer 110 may be formed on the connection surface 108 of the substrate 102. The adhesion layer 110 may include titanium and tungsten, for example with 70 weight percent to 95 weight percent tungsten, and 5 weight percent to 30 weight percent titanium. The titanium and tungsten may advantageously provide good adhesion of the adhesion layer 110 to the substrate 102. The adhesion layer 110 may be formed by a sputter process, and may be, for example, 100 nanometers to 700 nanometers thick.

A seed layer 112 is formed over the substrate 102, on the adhesion layer 110, if present, and on the substrate 102, if the adhesion layer 110 is not present. The term "over" should not be construed as limiting the position or orientation of the microelectronic device 100, but should be used to provide a spatial relationship between the seed layer 112 and the substrate 102. The seed layer 112 includes at least 90 weight percent zinc, so that copper may be subsequently electroplated on the seed layer 112, and so that the seed layer may be removed after electroplating the copper without significantly degrading the electroplated copper. The seed layer 112 may be formed by a sputter process. A lower limit of a thickness of the seed layer 112 may be determined by providing a low sheet resistance for uniform electroplating of the copper across the microelectronic device 100. In one aspect, an upper limit of the thickness of the seed layer 112 may be determined by a heating time to convert all the zinc in the seed layer 112 to brass, as increasing the thickness of the seed layer 112 requires increasing the heating time, undesirably reducing throughput. In another aspect, the upper limit of the thickness of the seed layer 112 may be determined by a criterion of limiting lateral growth of the brass, to avoid electrical shunts or fabrication process complication. By way of example, thicknesses of the seed layer 112 of 200 nanometers to 2 microns are sufficient to meet the criterion for the lower limit of the thickness and the criterion for the upper limit of the thickness.

The adhesion layer 110 provides adhesion between the seed layer 112 and the substrate 102. The adhesion layer 110 may also provide a diffusion barrier by reducing diffusion of the zinc from the seed layer 112 into the substrate 102. Limiting diffusion of the zinc into the substrate 102 may require a higher thickness for the adhesion layer 110 than that required for adhesion between the seed layer 112 and the substrate 102. Tungsten in the adhesion layer 110 may provide an enhanced diffusion barrier against zinc diffusion.

A plating mask 114 is formed over the seed layer 112. The plating mask exposes areas for conductor structures 116 and covers areas between the areas for the conductor structures 116. The plating mask 114 may include organic polymer material to facilitate subsequent removal without degrading the electroplated copper. In one version of this example, the plating mask 114 may include photoresist and may be formed by a photolithographic process. In another version, the plating mask 114 may be formed by an additive process which disposed the organic polymer material on the seed layer 112 using an inkjet apparatus or a material extrusion apparatus. In a further version, the plating mask 114 may be formed by a laser ablation process. The plating mask 114 may be higher than the subsequently-formed electroplated copper.

Figure 1B:
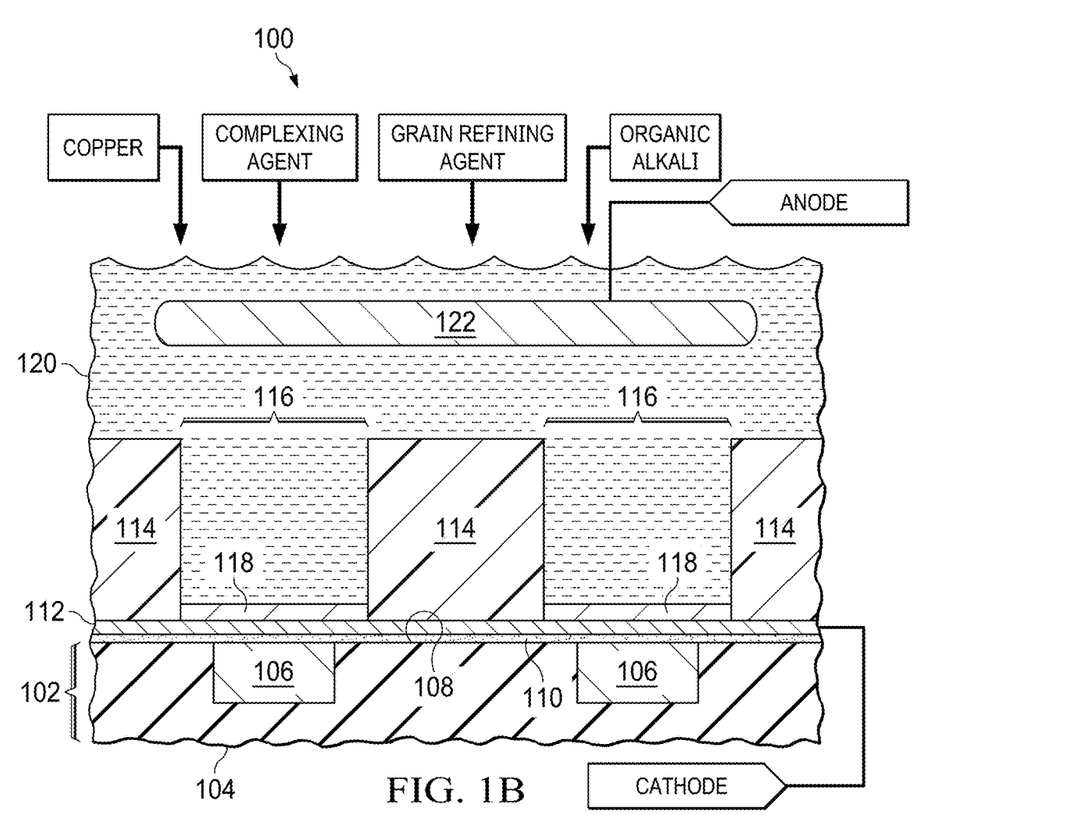

Referring to FIG. 1B, a copper strike layer 118 is formed on the seed layer 112 in the areas for the conductor structures 116 by a strike electroplating process using a neutral pH copper plating bath 120. The neutral pH copper plating bath 120 is formed by adding 1.5 grams/liter to 20 grams/liter of copper, denoted in FIG. 1B as "COPPER", to water. The copper may be added to the water in the form of an organic copper salt, such as copper acetate or copper citrate. The organic anion of the copper salt may help maintain the copper in solution when the pH of the neutral pH copper plating bath 120 is adjusted to neutral. In a variation of this example, a portion of the copper may be added to the water in the form of an inorganic copper salt, such as copper sulfate.

A complexing agent, denoted in FIG. 1B as "COMPLEXING AGENT", is added to the neutral pH copper plating bath 120 to further maintain the copper in solution when the pH of the neutral pH copper plating bath 120 is adjusted to neutral. The complexing agent may include an organic acid such as citric acid, ascorbic acid, or acetic acid. Other complexing agents are within the scope of this example. The complexing agent is added in sufficient quantity to maintain the copper in solution while not inhibiting electroplating of the copper onto the seed layer 112. The complexing agent may have a molar concentration of about half of a molar concentration of the copper to about twice the molar concentration of the copper. If a portion of the copper is added to the water in the form of an inorganic copper salt, the concentration of the complexing agent may be increased, to maintain the copper in solution.

A grain refining agent, denoted in FIG. 1B as "GRAIN REFINING AGENT", is added to the neutral pH copper plating bath 120 to increase uniformity of the thickness of the copper strike layer 118. The grain refining agent may be any of several commercially available grain refining agents for copper electroplating, and may be added to the neutral pH copper plating bath 120 at 0.01 grams/liter to 5 grams/liter. For example polyethyleneimine having a molecular weight of about 600 may be used as the grain refining agent, and be added to the neutral pH copper plating bath 120 at about 0.2 grams/liter to 2 grams/liter.

An organic alkali reagent, denoted in FIG. 1B as "ORGANIC ALKALI", is added to the neutral pH copper plating bath 120 in sufficient quantity to adjust the pH to about neutral, that is a pH value of 5 to 8. Values of the pH below 5 tend to etch the seed layer 112 before the copper strike layer 118 can be formed. Values of the pH above 8 tend to degrade the organic polymer in the plating mask 114. The organic alkali reagent may include, by way of example, ammonium hydroxide, tetramethyl ammonium hydroxide, tetraethyl ammonium hydroxide, or ethanol amine. The organic alkali reagent may provide additional complexing functionality to maintain the copper in solution. Organic alkali reagents with amine functional group may provide effective complexing functionality. Ammonium hydroxide or ethanol amine may provide more complexing functionality than tetramethyl ammonium hydroxide or tetraethyl ammonium hydroxide. Tetramethyl ammonium hydroxide or tetraethyl ammonium hydroxide may be less prone to evaporation from the neutral pH copper plating bath 120 than ammonium hydroxide. A mix of different organic alkali reagents may be used to attain a desired balance between providing complexing functionality and reducing loss by evaporation.

The copper strike layer 118 is formed by connecting the seed layer 112 to a cathode connection, denoted "CATHODE" in FIG. 1B, of the strike electroplating process, and connecting a strike anode 122, which is exposed to the neutral pH copper plating bath 120, to an anode connection, denoted "ANODE" in FIG. 1B, of the strike electroplating process. The strike anode 122 may include primarily copper so as to replenish copper in the neutral pH copper plating bath 120, or may include a metal such as platinum to reduce erosion of the strike anode 122 and thus extend the usable lifetime of the strike anode 122. During operation of the strike electroplating process, current flows from the strike anode 122 through the neutral pH copper plating bath 120 to the seed layer 112, electroplating copper from the neutral pH copper plating bath 120 onto the seed layer 112 to form the copper strike layer 118. The strike electroplating process may provide a current density of 1 amperes/square decimeter (ASD) to 10 ASD to form the copper strike layer 118. A temperature of the neutral pH copper plating bath 120 during the strike electroplating process may be, for example, room temperature, that is, 25° C., to 80° C. The copper strike layer 118 may be formed more quickly at higher temperature. The neutral pH copper plating bath 120 may degrade more quickly at higher temperature, for example, by loss of the organic alkali reagent due to evaporation. A temperature of the neutral pH copper plating bath 120 may be selected to provide a desired balance between a rate of formation of the copper strike layer 118 and reducing maintenance of the neutral pH copper plating bath 120. The copper strike layer 118 may be formed with a thickness of 0.5 microns to 2 microns, for example. A lower limit of the thickness of the copper strike layer 118 may be determined by a goal of having no pinholes or discontinuities in the copper strike layer 118 so as to protect the seed layer 112 from chemical attack during a subsequent copper plating process. An upper limit of the thickness of the copper strike layer 118 may be determined by throughput, as the copper strike layer 118 may be formed at a slower rate than a subsequently formed main copper layer using the subsequent copper plating process.

Having the pH value of the neutral pH copper plating bath 120 above 5 may advantageously reduce erosion, etching, or other degradation of the seed layer 112. Having the pH value of the neutral pH copper plating bath 120 below 8 may advantageously reduce degradation of the plating mask 114.

Figure 1C:
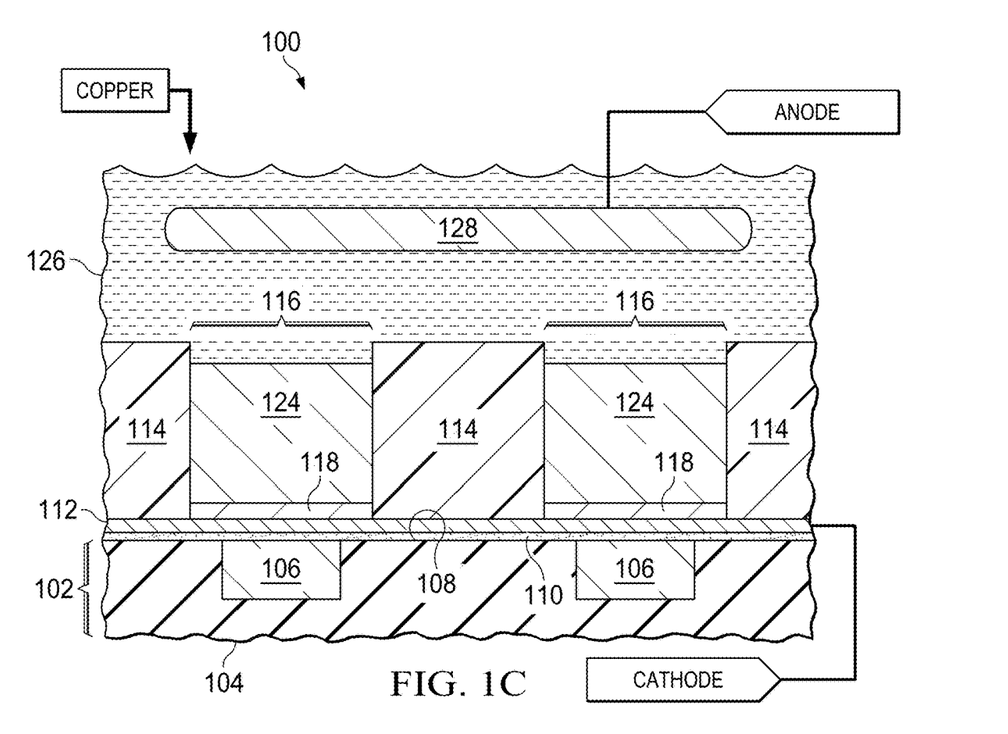

Referring to FIG. 1C, a main copper layer 124 is formed on the copper strike layer 118 in the areas for the conductor structures 116 by a main plating process using a copper plating bath 126. The copper plating bath 126 is formed by adding copper, denoted as "COPPER" in FIG. 1C, to water, for example in the form of a copper salt such as copper sulfate. Additives such as accelerators and grain refining agents may be added to the copper plating bath 126. A pH value of the copper plating bath 126 may be below 5, to provide a desired plating rate. The copper strike layer 118 may advantageously protect the seed layer 112 from degradation by the copper plating bath 126.

The main copper layer 124 is formed by connecting the seed layer 112 to a cathode connection, denoted "CATHODE" in FIG. 1C, of the main plating process, and connecting a main anode 128, which is exposed to the copper plating bath 126, to an anode connection, denoted "ANODE" in FIG. 1C, of the main plating process. The main anode 128 may include primarily copper, or may include a metal such as platinum. During operation of the main plating process, current flows from the main anode 128 through the copper plating bath 126 to the seed layer 112, electroplating copper from the copper plating bath 126 onto the copper strike layer 118 to form the main copper layer 124. The main plating process is continued to provide a desired thickness for the main copper layer 124. The main copper layer 124 may have a thickness of 1 micron to 100 microns, for example.

Figure 1D:
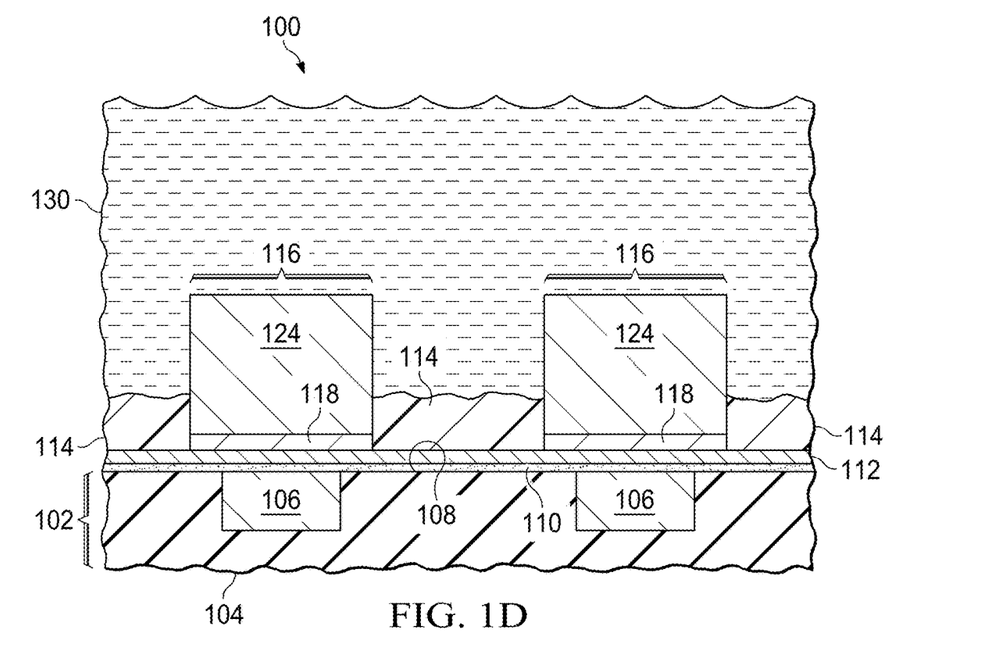

Referring to FIG. 1D, the plating mask 114 is removed. The plating mask 114 may be removed by a wet process using one or more organic solvents 130, such as phenol, NMP (1-methyl 2 pyrrolidon), DMSO (dimethyl sulfoxide), or sulfonic acid. Alternatively, the plating mask 114 may be removed by a dry process using oxygen radicals in a downstream asher or an ozone generator. A combination of a wet process and a dry process may be used to remove the plating mask 114. FIG. 1D shows removal of the plating mask 114 partway to completion.

Figure 1E:
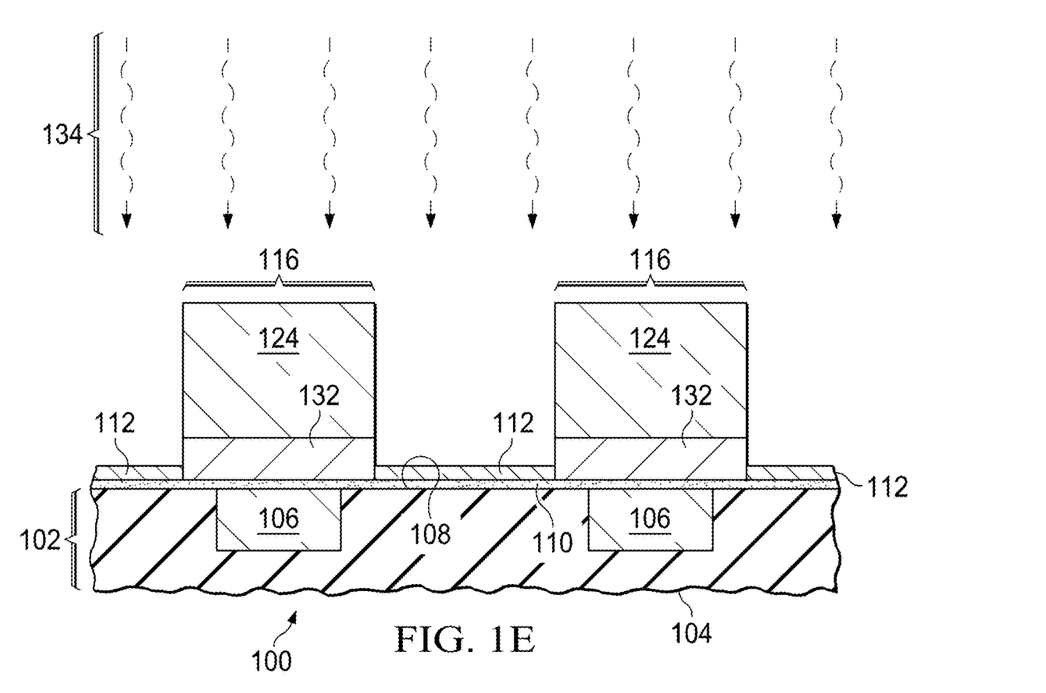

Referring to FIG. 1E, the main copper layer 124, the copper strike layer 118 of FIG. 1D, and the seed layer 112 are heated by a heating process 134, to diffuse copper from the copper strike layer 118 and the main copper layer 124, and to diffuse zinc from the seed layer 112, to form a brass layer 132 between the main copper layer 124 and the substrate 102. The brass layer 132 extends directly to the main copper layer 124. The brass layer 132 extends to the adhesion layer 110, if present. The seed layer 112 outside of the areas for the conductor structures 116 may not be significantly depleted by formation of the brass layer 132. The brass layer 132 includes 50 weight percent to 95 weight percent copper and 5 weight percent to 50 weight percent zinc. The brass layer 132 may be 2 to 10 times thicker than the seed layer 112. The brass layer 132 may be, for example, 1 micron to 5 microns thick.

The heating process 134 may include a radiant heat operation, as indicated schematically in FIG. 1E. Other implementations of the heating process 134, such as a hot plate process, an oven process, or a forced air process, are within the scope of this example. The heating process 134 may heat the main copper layer 124, the copper strike layer 118, and the seed layer 112 to a temperature of 250° C. to 350° C., for example. The heating process 134 is performed for a sufficiently long time period so that the seed layer 112 between the main copper layer 124 and the substrate 102 is consumed by formation of the brass layer 132. The heating process 134 is terminated so that the brass layer 132 does not extend laterally past the main copper layer 124 more than a thickness of the brass layer 132. For the purposes of this disclosure, the terms "lateral" and "laterally" are understood to refer to a direction parallel to a plane of the connection surface 108. By way of example, the heating process 134 may heat the main copper layer 124, the copper strike layer 118, and the seed layer 112 to a temperature of 300° C. for a time period of 10 minutes to 30 minutes. By way of another example, the heating process 134 may heat the main copper layer 124, the copper strike layer 118, and the seed layer 112 to a temperature of 250° C. for a time period of 25 minutes to 75 minutes. By way of a further example, the heating process 134 may heat the main copper layer 124, the copper strike layer 118, and the seed layer 112 to a temperature of 350° C. for a time period of 5 minutes to 10 minutes.

Figure 1F:
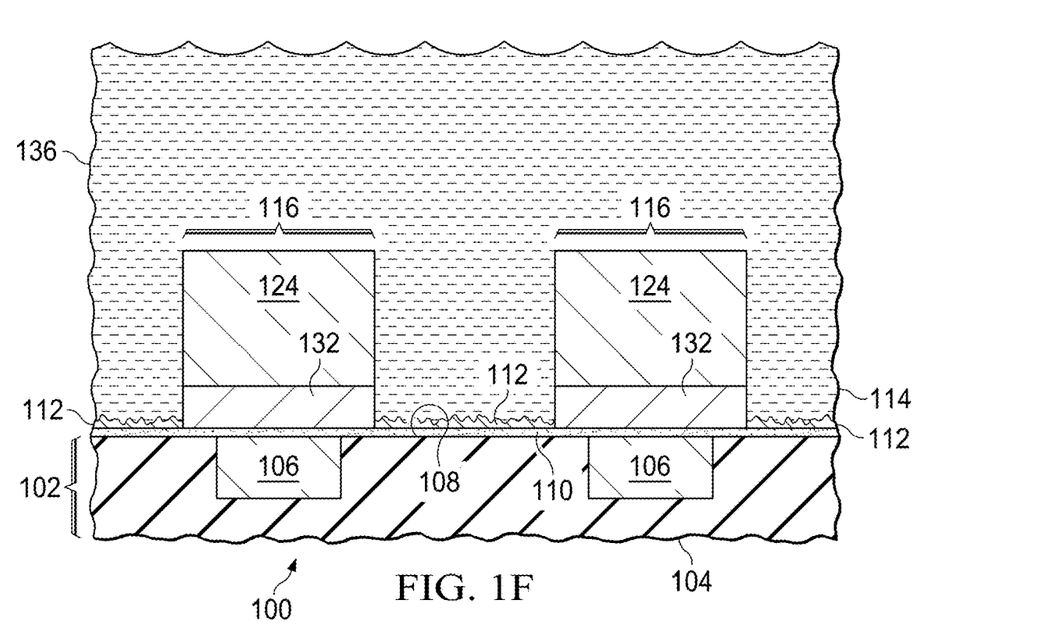

Referring to FIG. 1F, remaining portions of the seed layer 112, which are not part of the brass layer 132, are removed. The remaining portions of the seed layer 112 are removed by a wet etch process using a zinc etchant 136 which does not remove a significant amount of the brass layer 132 or the main copper layer 124. The zinc etchant 136 may include an aqueous solution of sulfuric acid or hydrochloric acid. The zinc etchant 136 may be implemented as an acidic copper plating bath, for example. Other reagents for removing the remaining portions of the seed layer 112 are within the scope of this example. During the wet etch process, zinc in the remaining portions of the seed layer 112 may provide cathodic protection for the brass layer 132 and the main copper layer 124, reducing degradation by the zinc etchant 136. Thus, undercut of the main copper layer 124 may be advantageously reduced compared to having a seed layer without zinc. Undercut of the main copper layer 124 is less than the thickness of the brass layer 132. FIG. 1F shows removal of the seed layer 112 partway to completion.

Figure 1G:
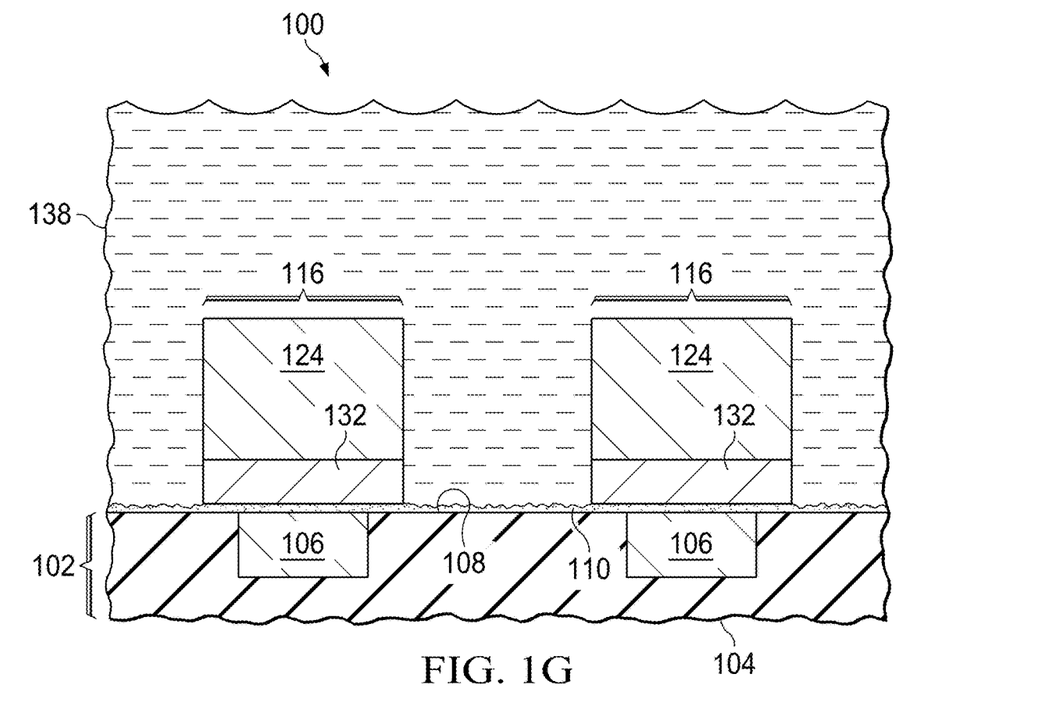

Referring to FIG. 1G, the adhesion layer 110 is removed where exposed by the brass layer 132. The adhesion layer 110 may be removed by a wet etch process using an oxidizing etchant 138 such as hydrogen peroxide. Other reagents for removing the adhesion layer 110 are within the scope of this example. Removal of the adhesion layer 110 is terminated before significant undercut of the brass layer 132 occurs. Undercut of the brass layer 132 is less than the thickness of the brass layer 132. FIG. 1G shows removal of the adhesion layer 110 partway to completion.

Figure 1H:
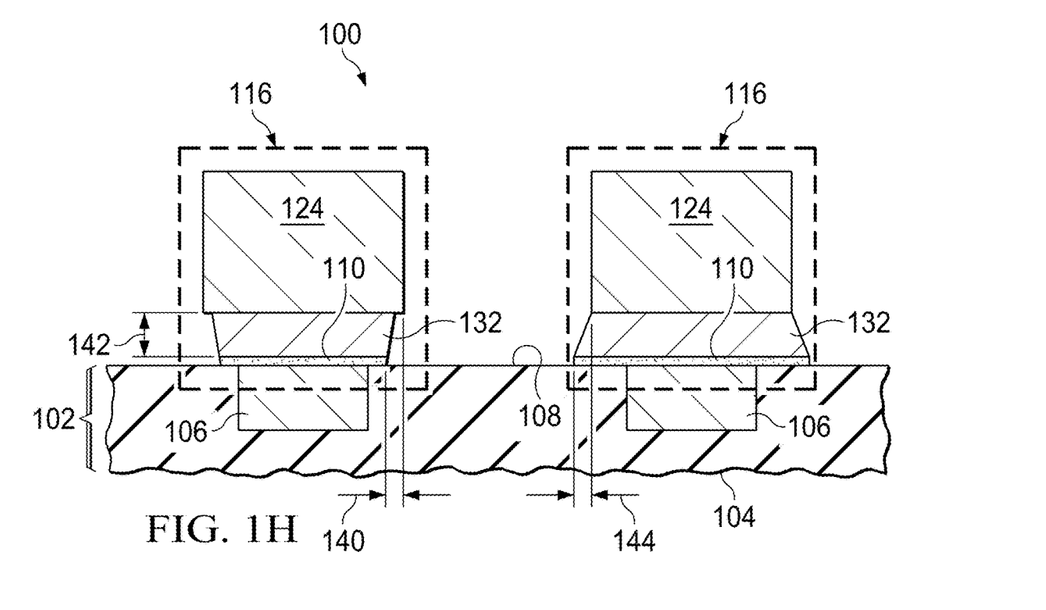

FIG. 1H depicts the microelectronic device 100 after formation of the conductor structures 116. The main copper layer 124 and the brass layer 132, and the adhesion layer 110, if present, under the brass layer 132, provide the conductor structures 116.

The adhesion layer 110 or the brass layer 132 may be laterally recessed from a lateral perimeter of the main copper layer 124 by an undercut distance 140 that is less than a thickness 142 of the brass layer 132. The undercut distance 140 may be less than 10 percent of the thickness 142 of the brass layer 132, advantageously reducing a design overlap of the conductor structures 116 over the electrically conductive elements 106.

The brass layer 132 may extend laterally past the perimeter of the main copper layer 124 by an underlap distance 144 that is less than a thickness 142 of the brass layer 132. The underlap distance 144 may be less than 10 percent of the thickness 142 of the brass layer 132, advantageously enabling placement of adjacent instances of the conductor structures 116 within the thickness 142 of the brass layer 132.

Figure 2:
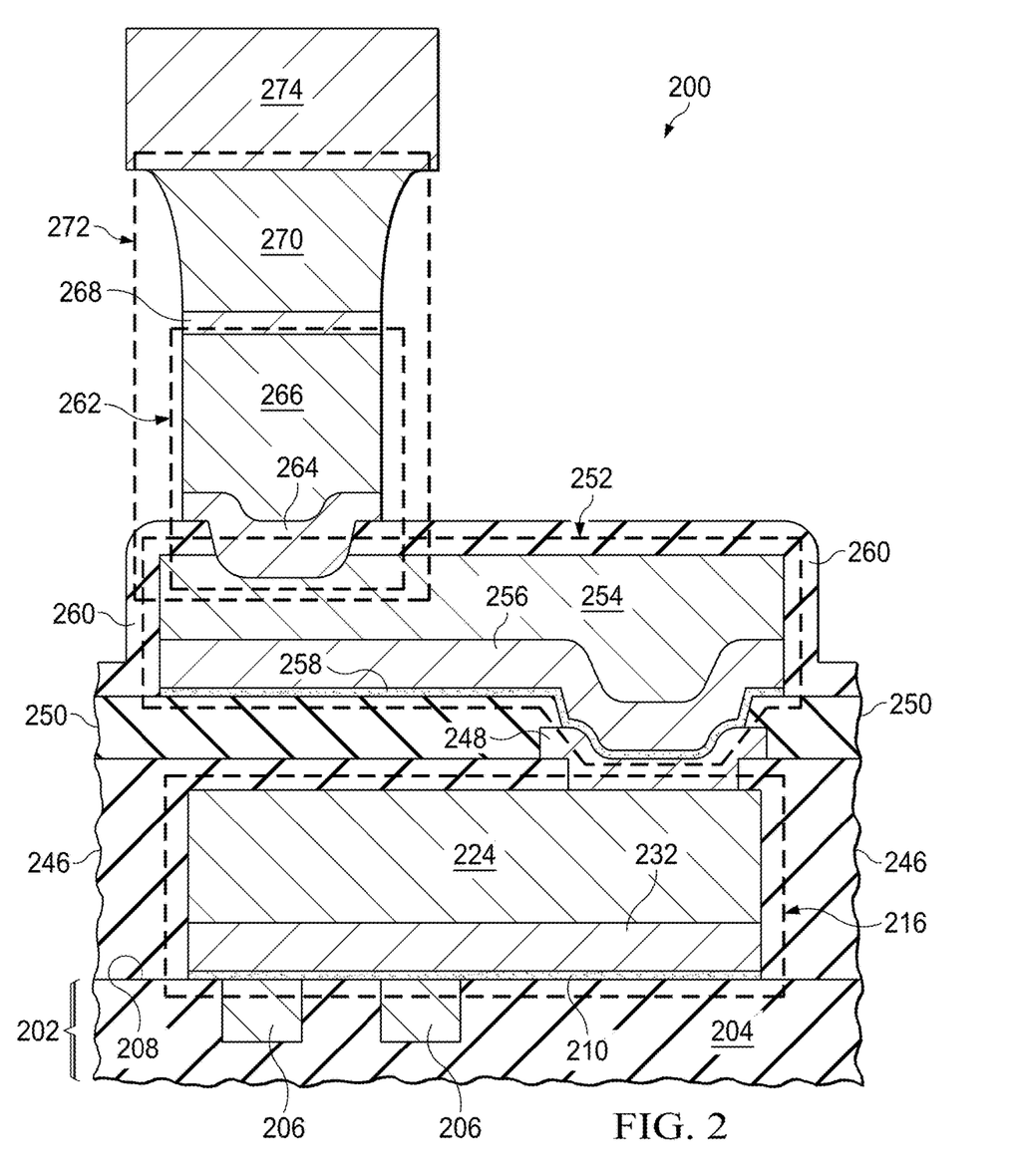
FIG. 2 is a cross section of an example microelectronic device having conductor structures in various configurations.

FIG. 2 is a cross section of an example microelectronic device having conductor structures in various configurations. The microelectronic device 200 may be implemented as an integrated circuit, a discrete semiconductor component, a micro electro-optical device, a MEMS device, or a microfluidics device, for example. The microelectronic device 200 has a substrate 202 which may include a first dielectric material 204 extending to a first surface 208 of the substrate 202, and may include electrically conductive elements 206 extending to the first surface 208. The first dielectric material 204 may be part of a dielectric layer stack in an interconnect region of the microelectronic device 200. The electrically conductive elements 206 may be electrically conductive vias of an interconnect structure of the microelectronic device 200, and may include tungsten, copper, or aluminum.

The microelectronic device 200 includes a first conductor structure 216 formed on the first surface 208, making electrical contact to one or more of the electrically conductive elements 206. The first conductor structure 216 may provide an interconnect of an interconnect layer for the microelectronic device 200. The first conductor structure 216 includes a first brass layer 232 on the first surface 208, and a first main copper layer 224 on the first brass layer 232. The first conductor structure 216 may optionally include a first adhesion layer 210 between the first brass layer 232 and the first surface 208. The first adhesion layer 210 may include titanium and tungsten, and may be, for example, 100 nanometers to 700 nanometers thick. The first brass layer 232 includes 70 weight percent to 90 weight percent copper and 10 weight percent to 30 weight percent zinc, and may be, for example, 1 micron to 5 microns thick. The first main copper layer 224 may be, for example, 3 microns to 30 microns thick. The first conductor structure 216 may be formed as disclosed in reference to FIG. 1A through FIG. 1H.

A second dielectric layer 246 is formed over the first conductor structure 216. The second dielectric layer 246 may include, for example, one or more layers of silicon dioxide, PSG, or polyimide. Silicon dioxide and PSG in the second dielectric layer 246 may be formed by plasma enhanced chemical vapor deposition (PECVD) processes, optionally followed by a planarizing process such as a chemical mechanical polish (CMP) process. Polyimide in the second dielectric layer 246 may be formed by a photolithographic process.

One or more I/O pads 248 are formed through the second dielectric layer 246 to make electrical contact with the first conductor structure 216. The I/O pads 248 may include, for example, one or more layers of titanium, titanium tungsten, nickel, palladium, aluminum alloy, copper, platinum, or gold. The I/O pads 248 may be formed by removing the second dielectric layer 246 in areas for the I/O pads 248, followed by forming layers of electrically conductive material, and patterning the layers of electrically conductive material, for example using a photolithographically-formed etch mask and a reactive ion etch (RIE) process or a wet etch process. Nickel, palladium or gold in the I/O pads 248 may be formed by electroless plating processes.

A third dielectric layer 250 is formed over the second dielectric layer 246 and the I/O pads 248, with openings over the I/O pads 248. The third dielectric layer 250 may include, for example, one or more layers of silicon dioxide, silicon nitride, silicon oxynitride, polyimide, or aluminum oxide.

The microelectronic device 200 includes a second conductor structure 252 formed on the third dielectric layer 250, making electrical contact to one or more of the I/O pads 248. The second conductor structure 252 may provide a redistribution layer (RDL) for the microelectronic device 200. The second conductor structure 252 includes a second brass layer 254 on the third dielectric layer 250, and a second main copper layer 256 on the second brass layer 254. The second conductor structure 252 may optionally include a second adhesion layer 258 between the second brass layer 254 and the third dielectric layer 250. The second adhesion layer 258 may include titanium and tungsten, and may be, for example, 100 nanometers to 700 nanometers thick. The second brass layer 254 includes 70 weight percent to 90 weight percent copper and 10 weight percent to 30 weight percent zinc, and may be, for example, 1 micron to 5 microns thick. The second main copper layer 256 may be, for example, 5 microns to 20 microns thick. The second conductor structure 252 may be formed as disclosed in reference to FIG. 1A through FIG. 1H.

A fourth dielectric layer 260 is formed over the second conductor structure 252. The fourth dielectric layer 260 may include, for example, one or more layers of polyimide or polyester. The fourth dielectric layer 260 may be formed by a photolithographic process, to have one or more openings over the second conductor structure 252.

The microelectronic device 200 includes a third conductor structure 262 formed on the second conductor structure 252, making electrical contact to the second conductor structure 252 through one of the openings in the fourth dielectric layer 260. The third conductor structure 262 may provide a bump bond pillar for the microelectronic device 200. The third conductor structure 262 includes a third brass layer 264 on the second main copper layer 256, and a third main copper layer 266 on the third brass layer 264. The third brass layer 264 includes 70 weight percent to 90 weight percent copper and 10 weight percent to 30 weight percent zinc, and may be, for example, 1 micron to 5 microns thick. The third main copper layer 266 may be, for example, 10 microns to 50 microns thick.

The third conductor structure 262 may be formed as disclosed in reference to FIG. 1A through FIG. 1H. The seed layer for the third conductor structure 262 may be formed directly on the second main copper layer 256, without an adhesion layer. When the seed layer is heated to form the third brass layer 264, zinc from the seed layer and copper from the second conductor structure 252 will diffuse, so that the third brass layer 264 extends partway into the second main copper layer 256, as indicated in FIG. 2.

A diffusion barrier 268 may be formed on the third main copper layer 266, opposite from the third brass layer 264, and a solder bump 270 may be formed on the diffusion barrier 268 opposite from the third main copper layer 266. A combination of the third conductor structure 262, the diffusion barrier 268, and the solder bump 270 may provide a bump bond structure 272 of the microelectronic device 200. The solder bump 270 may be attached to an external lead 274 by a solder reflow process. The external lead may be implemented as a lead of a lead frame, or a trace on a circuit board, for example.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A method of forming a microelectronic device, comprising:
    forming a seed layer over a substrate, the seed layer including at least 90 weight percent zinc;
    forming a plating mask on the seed layer;
    forming a copper strike layer on the seed layer where exposed by the plating mask by an electroplating process using a neutral pH copper plating bath;
    forming a main copper layer on the copper strike layer using a copper plating process;
    removing the plating mask;
    heating the seed layer, the copper strike layer and the main copper layer to form a brass layer between the main copper layer and the substrate, the brass layer including 50 weight percent to 95 weight percent copper and 5 weight percent to 50 weight percent zinc; and
    removing the seed layer where exposed by the brass layer, the brass layer and the main copper layer providing a conductor structure of the microelectronic device.

2. The method of claim 1, further including forming an adhesion layer on the substrate prior to forming the seed layer, and removing the adhesion layer where exposed by the brass layer after removing the seed layer.

3. The method of claim 1, wherein the neutral pH copper plating bath includes 1.5 grams/liter to 20 grams/liter of copper.

4. The method of claim 1, wherein the neutral pH copper plating bath includes a complexing agent in sufficient quantity to maintain the copper in solution.

5. The method of claim 1, wherein the neutral pH copper plating bath has a pH value of 5 to 8.

6. The method of claim 1, wherein the neutral pH copper plating bath includes at 0.01 grams/liter to 5 grams/liter of a grain refining agent.

7. The method of claim 1, wherein the neutral pH copper plating bath is at a temperature of 25° C. to 80° C.

8. The method of claim 1, wherein the main copper layer is formed in a plating bath having a pH value less than 5.

9. The method of claim 1, wherein heating the seed layer, the copper strike layer and the main copper layer to form the brass layer includes heating the seed layer, the copper strike layer and the main copper layer at a temperature of 250° C. to 350° C. for 5 minutes to 75 minutes.

10. The method of claim 1, wherein removing the seed layer is performed by a wet etch process using a zinc etchant which does not remove a significant amount of the brass layer or the main copper layer.

* * * * *